US012647124B2

(12) United States Patent
Roy et al.

(10) Patent No.: US 12,647,124 B2
(45) Date of Patent: Jun. 2, 2026

(54) MEASUREMENT SYSTEM WITH CORRECTION FOR TEMPERATURE-BASED CONVERTER FEEDBACK ERROR

(71) Applicant: CIRRUS LOGIC INTERNATIONAL SEMICONDUCTOR LTD., Edinburgh (GB)

(72) Inventors: Tonmoy Roy, Pflugerville, TX (US); Johnny Klarenbeek, Austin, TX (US); Ashwin Vijayan, Austin, TX (US); Eric J. King, Austin, TX (US); John L. Melanson, Austin, TX (US); Rishi Ahuja, Broomfield, CO (US); Jaiminkumar Mehta, Austin, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 181 days.

(21) Appl. No.: 18/796,615

(22) Filed: Aug. 7, 2024

(65) Prior Publication Data

US 2026/0045955 A1 Feb. 12, 2026

(51) Int. Cl.
H03M 1/10 (2006.01)
H03M 1/08 (2006.01)
H03M 3/00 (2006.01)

(52) U.S. Cl.
CPC ........... H03M 1/089 (2013.01); H03M 3/368 (2013.01); H03M 3/426 (2013.01)

(58) Field of Classification Search
USPC ........................ 341/119, 118, 120, 155, 143
See application file for complete search history.

(56) References Cited

U.S. PATENT DOCUMENTS

| | | | |
|---|---|---|---|
| 5,400,025 A | 3/1995 | Pfieffer | |
| 11,714,015 B1 * | 8/2023 | Berg | G01L 9/045 |
| | | | 73/708 |
| 11,777,516 B2 | 10/2023 | Melanson et al. | |
| 2012/0096288 A1 * | 4/2012 | Bates | G06F 1/206 |
| | | | 713/320 |

FOREIGN PATENT DOCUMENTS

GB 2612185 A 8/2023

OTHER PUBLICATIONS

Search Report in UK Patent Application Ser No. GB25111238.4 mailed on Dec. 31, 2025.

* cited by examiner

*Primary Examiner* — Peguy Jean Pierre
(74) *Attorney, Agent, or Firm* — Andrew M. Harris; Mitch Harris, Atty at Law, LLC

(57) ABSTRACT

Integrating ADC based sensing systems that convert the output of a measurement sensor to a digital value avoid conversion errors caused by sensor temperature variation during the conversion cycle. The systems may either include a primary integrating ADC and a residue ADC, and adjust rate of operation of the ADCs independently according to a sensed temperature of the measurement sensor, or the systems may differentiate an output of the residue ADC, and apply a temperature correction in accordance with the sensed temperature of the sensor to an output of the differentiator, integrate the temperature-corrected output of the differentiator and then combine the result with the output of the primary integrating ADC.

32 Claims, 7 Drawing Sheets

MEASUREMENT SYSTEM WITH CORRECTION FOR TEMPERATURE-BASED CONVERTER FEEDBACK ERROR

BACKGROUND

1. Field of Disclosure

The field of representative embodiments of this disclosure relates to analog-to-digital converter (ADC) circuits, and in particular to techniques for reducing error due to changes in temperature of sensors under measurement during a conversion cycle.

2. Background

Integrating analog-to-digital converters (ADC) are commonly used to evaluate measurement inputs, in particular inputs from sensors such as current-sensing resistors. By including inherent integration in an input stage or a subsequent converter stage, measurement noise is reduced over the integration period. Such ADCs may be pipelined to include a residue converter that accounts for the difference between the output of the integrator, and the digital conversion values.

When ambient temperature changes, or the temperature of the sensing element of the sensor changes for other reasons such as power dissipation, the difference between the sensor resistance from the integration period to the application of feedback that cancels accumulated integrator charge to produce the digital output, i.e., at evaluation time, causes a temperature-based error in the measurement value, that is potentially present at each update of the register value. Feedback is applied according to the updated register value, which can cause numerous temperature-based errors to accumulate during the conversion cycle, which do not align with the residue and are not accounted for in the residue values.

Solutions exist that compensate for temperature variation in the sensor by using a temperature sensor to determine a correction to apply to the converter output and residue values for a conversion, but such compensation does not correct for error due to temperature changes between the integration interval and the application of feedback from the conversion result, in particular from the partial result accumulating in an integrating ADC during a conversion cycle.

Therefore, it would be advantageous to reduce the impact of temperature changes in a measurement system that cause converter feedback error.

SUMMARY

Impact of temperature changes in a system including an integrating ADC circuit are reduced in systems and their methods of operation according to embodiments of the present disclosure.

The systems include a first sensor for generating an electrical output, an integrating ADC having a first converter circuit that first converts the output of the sensor to provide first digital output values, a second converter circuit that converts residues of the first converter to provide second digital output values, a combiner that combines the first digital output values with the second digital output values to provide an output of the analog-to-digital converter, and a control circuit that controls conversions of the first converter circuit and the second converter circuit.

The systems also include a second sensor for providing an indication of a temperature of the first sensor. In some embodiments, the control circuit is coupled to the second sensor and adjusts a second rate of operation of the second converter independent of a first rate of operation of the first converter in conformity with the indication of the temperature of the first sensor. In some embodiments, the system includes a differentiator that differentiates a sequence of the second digital output values, a temperature corrector that applies a temperature correction in accordance with the indication of the temperature of the first sensor to an output of the differentiator, an integrator that integrates a temperature-corrected output of the temperature corrector, and a combiner that adds the first digital output values to an output of the integrator to provide the output of the integrating analog-to-digital converter.

The summary above is provided for brief explanation and does not restrict the scope of the claims. The description below sets forth example embodiments according to this disclosure. Further embodiments and implementations will be apparent to those having ordinary skill in the art. Persons having ordinary skill in the art will recognize that various equivalent techniques may be applied in lieu of, or in conjunction with, the embodiments discussed below, and all such equivalents are encompassed by the present disclosure.

DESCRIPTION OF ILLUSTRATIVE EMBODIMENT

The present disclosure encompasses systems and methods that use integrating ADC circuits to convert the output of a measurement sensor to a digital value. The systems and methods correct for temperature error that would otherwise occur due to temperature changes at the measurement sensor during a conversion cycle. The systems may either include a primary integrating ADC and a residue ADC and adjust rate of operation of the ADCs independently according to a sensed temperature of the measurement sensor, or the systems may differentiate an output of the residue ADC, and apply a temperature correction in accordance with the sensed temperature of the sensor to an output of the differentiator, integrate the temperature-corrected output of the differentiator and then combine the result with the output of the primary integrating ADC.

Figure 1:
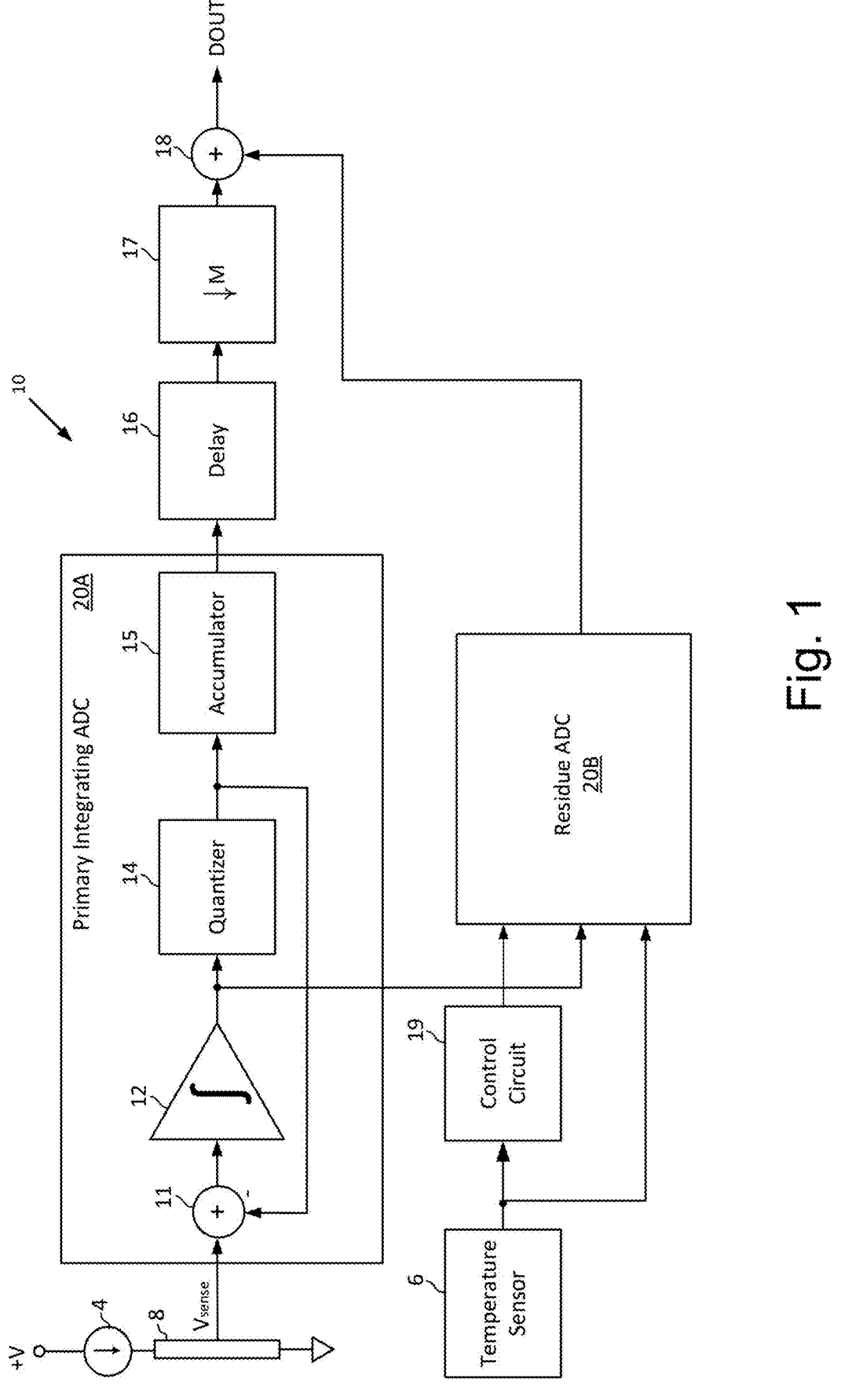
FIG. 1 is a block diagram showing an example measurement system 10, in accordance with an embodiment of the disclosure.

Referring now to FIG. 1, a block diagram of an example measurement system 10 is shown, in accordance with an embodiment of the disclosure. Example measurement system 10 receives a sense voltage $V_{sense}$ from a sensor 8, which in the illustrative example, is an integrated or discrete resistive element, or which maybe another conductor such as a circuit interconnect, e.g., a circuit trace. A current load 4 draws a current from a power supply, and the current is conducted through sensor 8, to generate sense voltage $V_{sense}$ as an output of sensor 8. A primary integrating analog-to-digital converter (ADC) 20A receives sense voltage $V_{sense}$, which is integrated by an integrator 12 that provides an output to a quantizer 14 that generates digital conversion values. The conversion values are accumulated in an accumulator 15 and also provide negative feedback to the input of integrator 12 via a combiner 11. In some embodiments, primary integrating ADC 20A may be a sigma-delta ADC 12, and accumulator 15 may be replaced with a more complex noise-shaping filter.

A secondary residue ADC 20B receives the output of integrator 12 and is used to provide lower significant bits of an output DOUT that is produced by a combiner 18 that combines the output of residue ADC 20B with the output of primary integrating ADC 20A after the output of primary integrating ADC 20A is delayed by a delay block 16 and decimated by a decimator 17 to the number of most-significant bits provided by primary integrating ADC 12. A control circuit 19 provides sequencing of conversions by primary integrating ADC 20A and residue ADC 20B.

Figure 2:
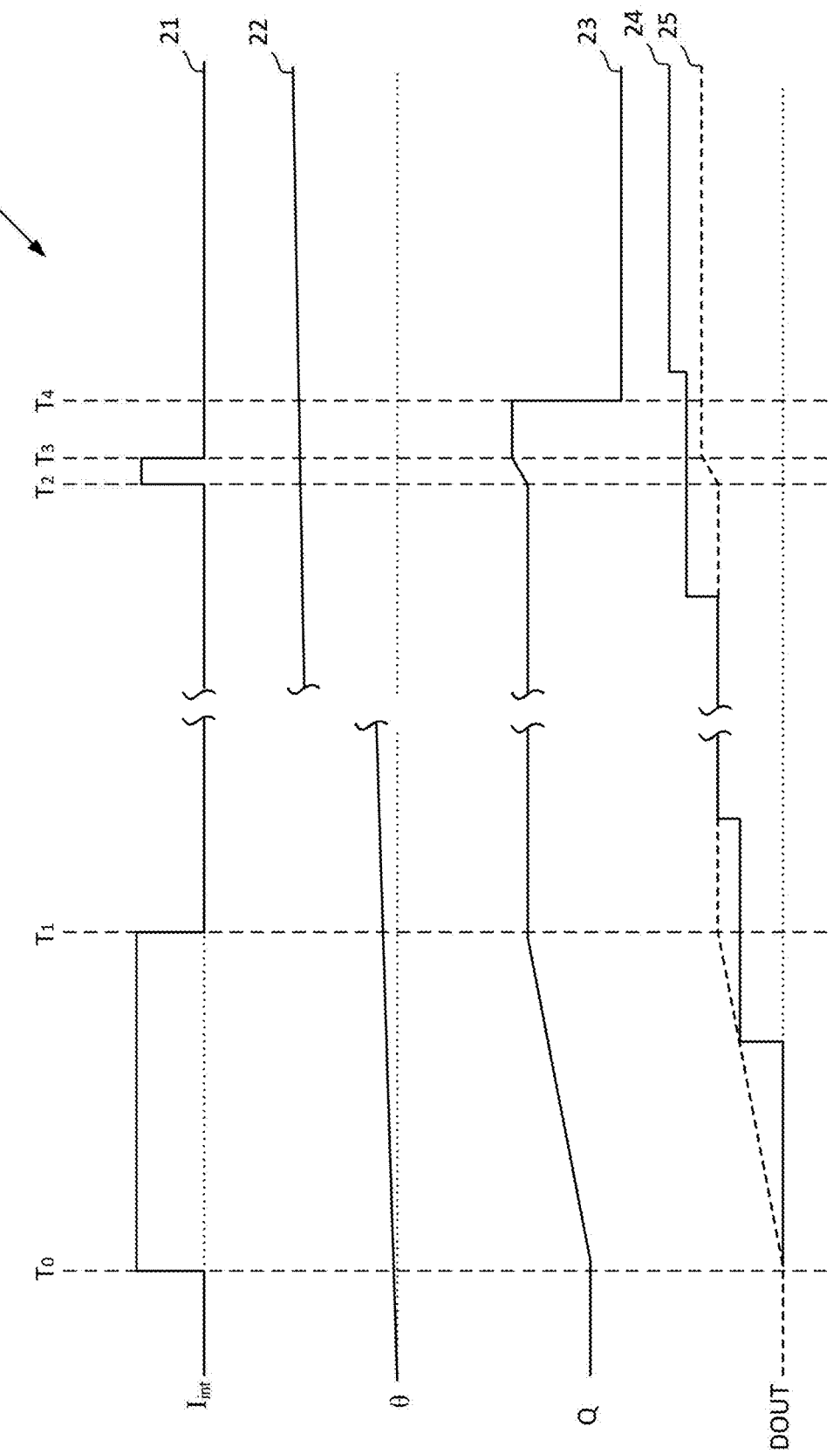
FIG. 2 is an example waveform diagram 20 illustrating operation of example measurement system 10, in accordance with an embodiment of the disclosure.

Referring additionally to FIG. 2, an example waveform diagram 20 illustrating operation of example measurement system 10 is shown, in accordance with an embodiment of the disclosure. Trace 22 shows a temperature θ of sensor 8 over a conversion cycle, while trace 21 shows the input current $I_{int}$ of integrator 12, as a worst-case example. Between times $T_0$ and $T_1$, input current $I_{int}$ is representative of sensor output voltage $V_{sense}$ for a lower value of sensor temperature θ than the temperature of sensor between times $T_2$ and $T_3$. Trace 23 shows the charge Q accumulated on integrator 12, and trace 24 shows the digital output value DOUT that would result from applying a polynomial temperature correction to the outputs of primary integrating ADC 20A and residue ADC 20B, without taking into account the differences in sensor temperature θ between times $T_1$ and $T_2$, i.e., during the integration/measurement interval. Between times $T_2$ and $T_3$, when the charge removed from integrator 12 due to the short pulse in input current $I_{int}$ between times $T_2$ and $T_3$ causes a feedback event at time $T_4$ as shown in trace 23 of integrator charge Q, error results in digital output value DOUT, which are the differences between trace 24 of digital output value DOUT and trace 25, which is the ideal value of digital output value DOUT. Trace 25 represents the values of DOUT attainable with the temperature correction provided in example measurement system 10. To prevent or remove the above-described errors, example measurement system 10 provides different forms of temperature correction, in accordance with various embodiments of the disclosure as described below.

Figure 3:
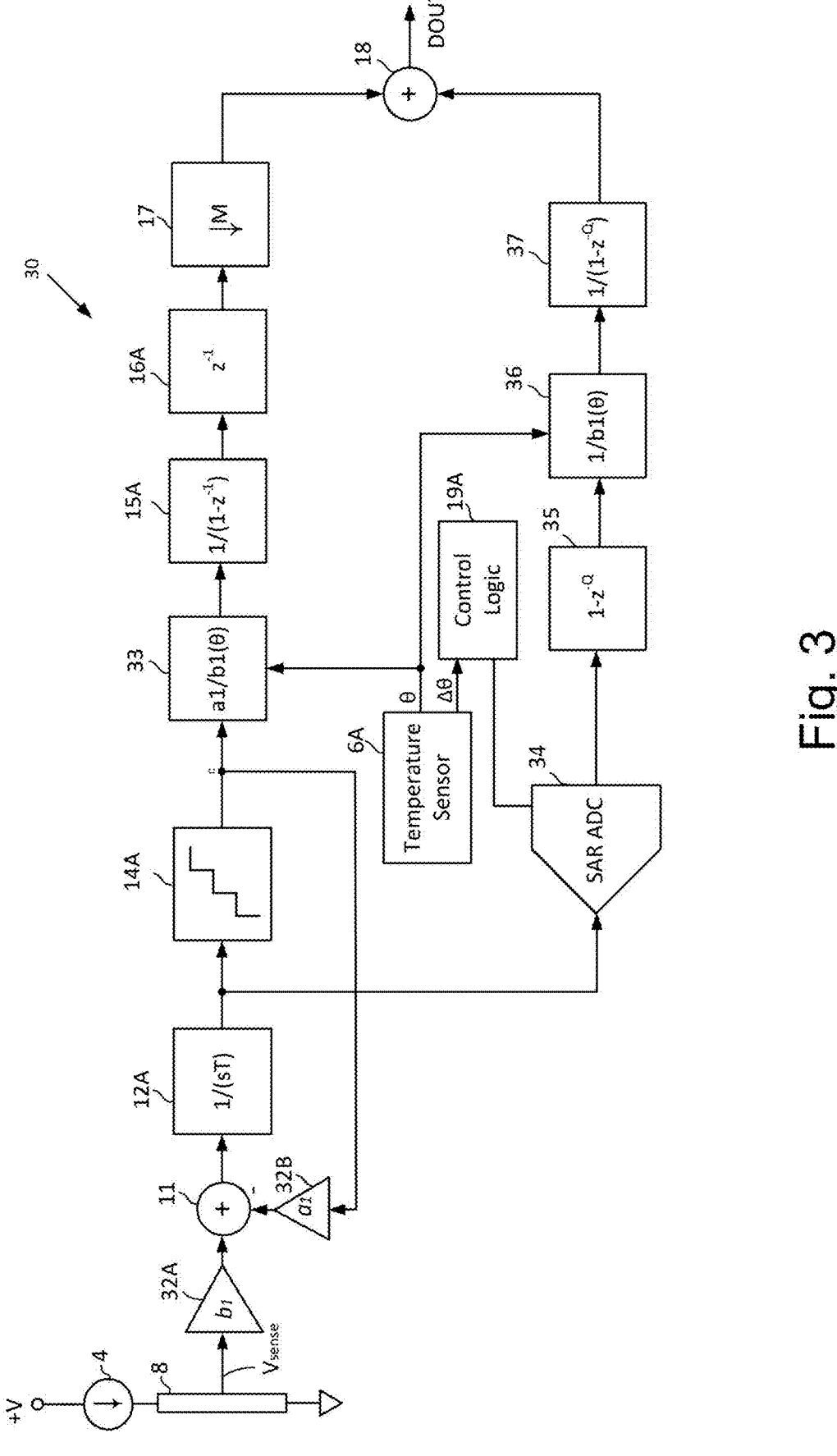
FIG. 3 is a detailed block diagram showing an example measurement system 30 that may be used to implement example measurement system 10, in accordance with an embodiment of the disclosure.

Referring now to FIG. 3, a detailed block diagram showing an example measurement system 30 that may be used to implement example measurement system 10 is shown, in accordance with an embodiment of the disclosure. Example measurement system 30 shows effects of non-ideal scaling elements 32A and 32B, which scale sensor output voltage $V_{sense}$ provided to an integrator 12A by a factor $b_1$ and output values from a quantizer 14A by a factor $a_1$, respectively. Temperature correction according to a factor $a_1/b_1(\theta)$ is applied to the output of quantizer 14A by a first temperature correction block 33, where $b_1(\theta)$ is a temperature-corrected gain corresponding to an ideal value of scaling factor $b_1$ over the range of sensor temperature θ. Temperature correction according to a factor $1/b_1(\theta)$ is applied by a second temperature correction block 36 to the output of a differentiator 35 that differentiates an output of a successive approximation register (SAR)-type ADC 34 that implements a residue converter. The temperature-corrected output of second temperature correction block 36 computed by second temperature correction block 36 is integrated by an integration block 37, the output of which is combined by combiner 18 with the output of decimator 17 to provide digital output DOUT of example measurement system 30. By differentiating, temperature correcting, and then integrating the output of the residue converter implemented by SAR ADC 34, a continuous value is available to combine with the primary integrating ADC implemented by integrator 12A and quantizer 14A, which can be retained past the individual conversion steps of the primary ADC, and which will be substantially valid during the conversion steps. Control logic 19A may thereby operate the primary integrating converter and the residue converter at different rates. Temperature sensor 6A provides an input Δθ to a control logic 19A, which may trigger control logic to operate residue converter at a higher rate, or on demand, when sensor temperature θ changes.

Figure 4:
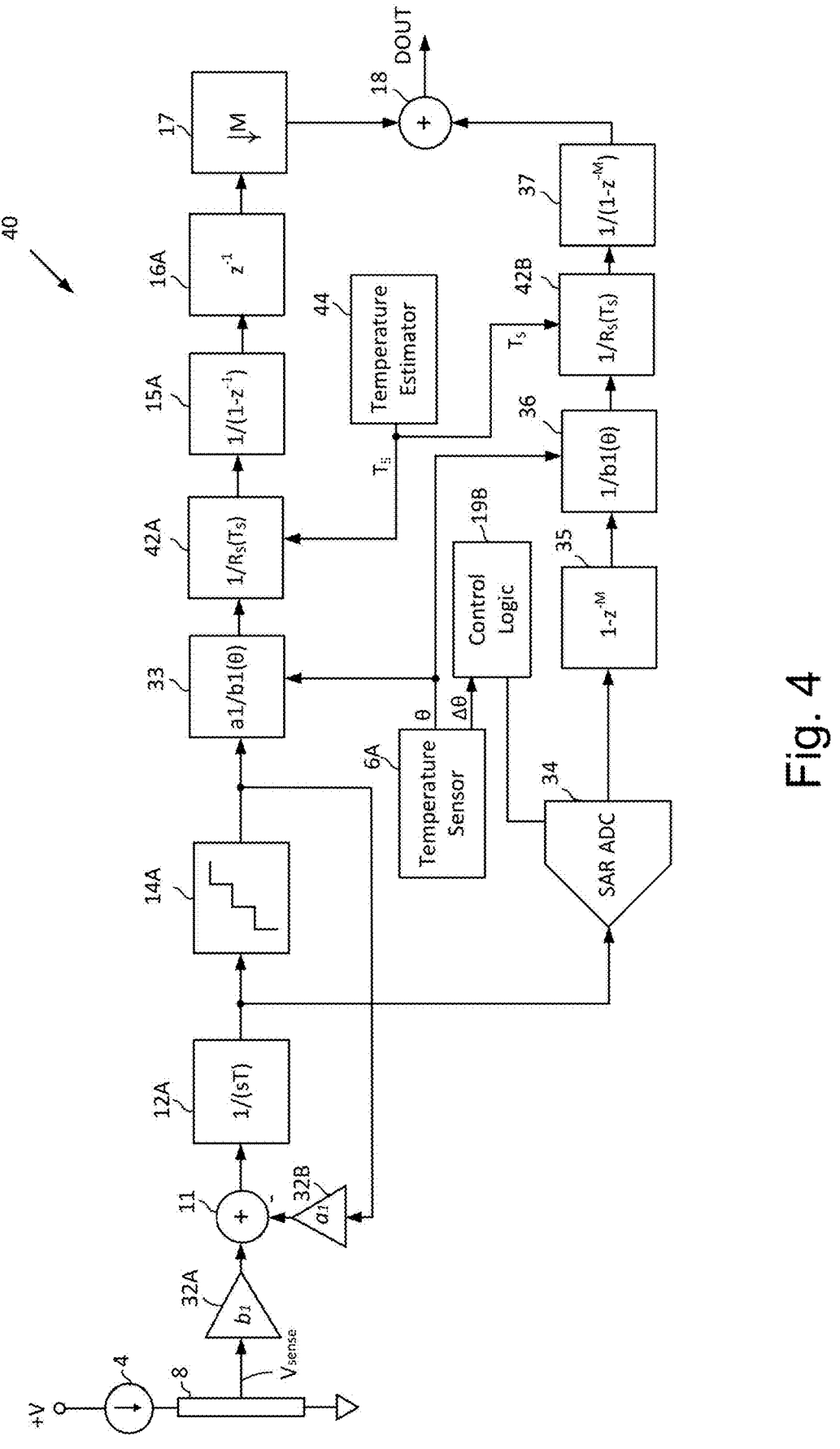
FIG. 4 is a detailed block diagram showing another example measurement system 40 that may be used to implement example measurement system 10, in accordance with another embodiment of the disclosure.

Referring now to FIG. 4, a detailed block diagram of another example measurement system 40 that may be used to implement example measurement system 10 is shown, in accordance with another embodiment of the disclosure. Example measurement system 40 is similar to example measurement system 30 of FIG. 3, so only differences between them will be described in further detail below. In example measurement system 40, a control logic 19B that performs the control of the primary integrating ADC and the residue ADC is not required to operate the primary integrating ADC and residue ADC at different rates and/or triggering residue ADC according to temperature changes, but may perform such operation in conjunction with the alternate temperature correction schemes embodied in example measurement system 40. In example measurement system 40, a model, which may be an approximation, relating the actual temperature of sensor 8 to one or more indications of the temperature of sensor 8, is implemented by a temperature estimator 44. Temperature estimator 44 receives one or more inputs such as: the ambient temperature, the temperature of a die on which example measurement system 40 is integrated, resistance of a conductor such as a circuit trace or a semiconductor or resistive temperature sensor with controlled reference operating conditions, or other suitable sensing device. Temperature estimator 44 then computes a sensor temperature estimate $T_S$ using, for example, a polynomial model, from the one or more sensing inputs. Temperature correction in example measurement system 40 is implemented by additional temperature correction blocks 42A and 42B, which apply a factor $$\frac{1}{R_S(T_s)}$$

to the output of first temperature correction block 33 and second temperature correction block 36, respectively, according to estimated sensor temperature $T_S$. The resulting operation provides continuous compensation for the temperature of sensor 8, which eliminates the temperature due to changes in sensor temperature θ to the degree of accuracy of the estimate of sensor temperature θ. Sensor temperature estimate $T_S$ may be obtained from one or more of a number of different metrics or combinations of multiple metrics, which are described in further detail below with reference to different embodiments of the disclosure.

Figure 5A:
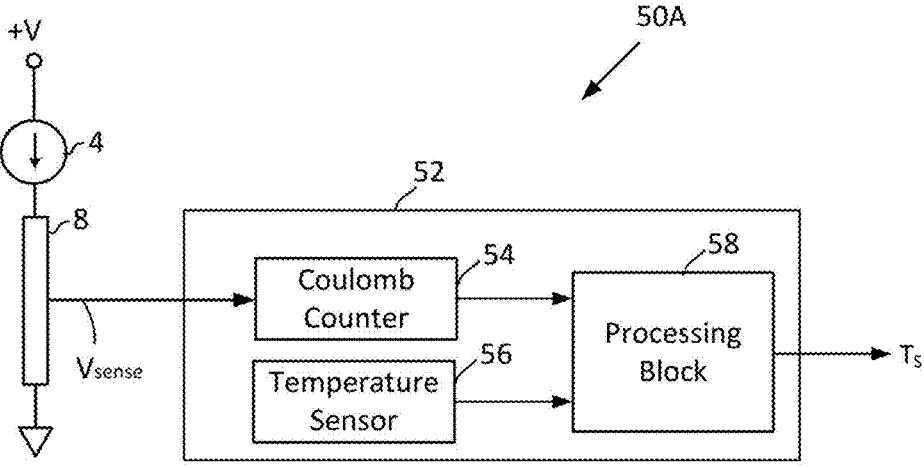
FIG. 5A is a block diagram showing an example temperature estimation circuit 50A, as may be implemented by temperature estimation block in system 40 of FIG. 4, in accordance with an embodiment of the disclosure.

FIG. 5A is a block diagram showing an example temperature estimation circuit 50A, as may be used to implement temperature estimation block in system 40 of FIG. 4, in accordance with an embodiment of the disclosure. The temperature-dependent resistance R of a sense resistor $R_{SENSE}$ that implements sensor 8 may be modeled as:

$$R = \frac{R_S}{1 + \alpha \Delta T_S},$$

where α is a conductivity temperature coefficient and $R_S$ is a nominal resistance at a base temperature T and $\Delta T$ is the deviation of the actual temperature $T_S$ of sense resistor $R_{SENSE}$ from base temperature T. The power dissipation of sense resistor $R_{SENSE}$ is given by:

$$P_{SENSE} = \frac{V_{SENSE}^2}{R} = \frac{V_{SENSE}^2}{\left(\frac{R_S}{1 + \alpha \Delta T_S}\right)}.$$

The actual temperature $T_S$ of sense resistor $R_{SENSE}$ may be thermally-modelled as:

$$T_S = f(P_{SENSE}, T_{int}, T_{ambient}),$$

where $T_{int}$ is the internal temperature of the die on which the measurement system is integrated, and $T_{ambient}$ is the ambient temperature. A coulomb counter 54 tracks the charge transferred from sense resistor $R_{SENSE}$, from which the power dissipation due to the input current can be determined, and one or more temperature sensors 56 provide the temperature measurement inputs required by the model. A processing block 58 computes estimated sensor temperature $T_S$ from the power and temperature inputs by solving a thermal model of the associated components. Estimated sensor temperature $T_S$, which may then be used in system 40 of FIG. 4 to perform temperature-corrected measurement, in accordance with an embodiment of the disclosure.

Figure 5B:
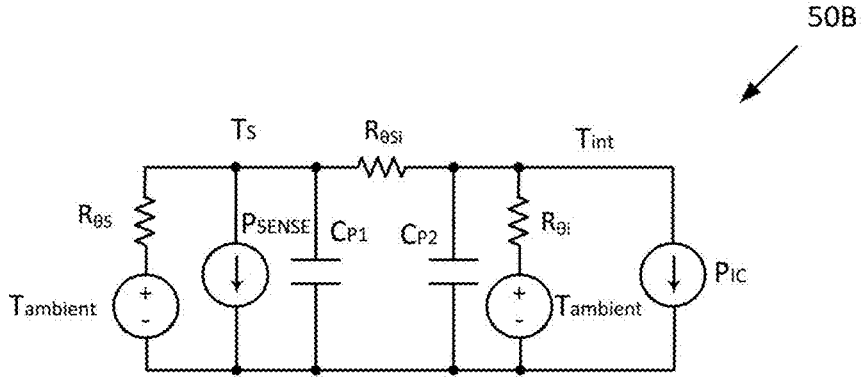
FIG. 5B is a schematic diagram showing an example thermal model 50B, as may be used to implement temperature estimation 50A of FIG. 5A, in accordance with an embodiment of the disclosure.

Referring now to FIG. 5B, a schematic diagram showing an example thermal model 50B, as may be implemented by temperature estimation circuit 50A of FIG. 5A is shown, in accordance with an embodiment of the disclosure. Example thermal model 50B is an example of a thermal circuit, i.e., thermal sinks, source and thermal coupling mechanisms that may be modeled as an electrical circuit in order to solve a thermal problem. Once thermal resistances $R_{\theta S}$, $R_{\theta i}$ and $R_{\theta S i}$, which are the thermal conductance from sense resistor $R_{SENSE}$ to temperature sensor 56, the thermal conductance from sensor 8 to temperature sensor 56, and the thermal conductance between sense resistor $R_{SENSE}$ and temperature sensor 56 are all determined, the circuit can be solved to determine sensor temperature $T_S$, from ambient temperature $T_{ambient}$ and the internal temperature $T_{int}$ of the die. The model solution is also dependent on the sensor power dissipation $P_{SENSE}$, as determined above and the power dissipation of the die $P_{IC}$, which should be available as a system-level metric.

Figure 6:
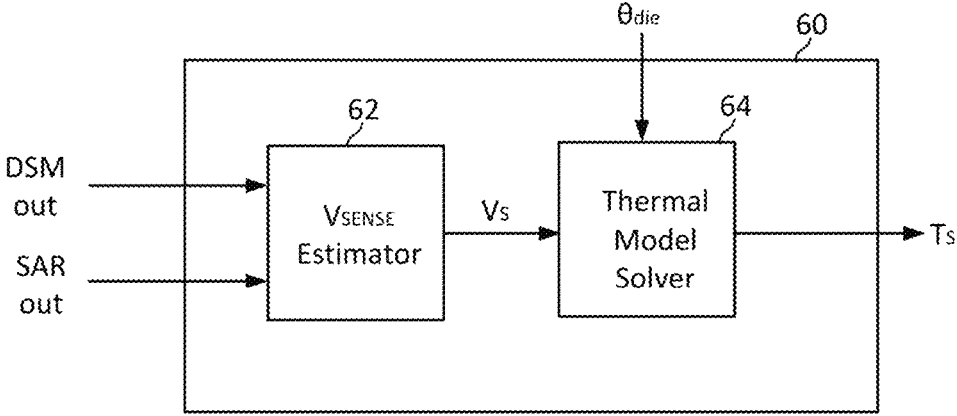
FIG. 6 is a block diagram showing an example temperature estimation circuit 60, as may be used to implement temperature estimation block in system 40 of FIG. 4, in accordance with an embodiment of the disclosure.

FIG. 6 is a block diagram showing another example temperature estimation circuit 60, as may be used to implement temperature estimation block in system 40 of FIG. 4, in accordance with another embodiment of the disclosure. A sense voltage $V_{SENSE}$ estimator 62 provides an estimate $V_S$ of sense voltage $V_{SENSE}$, which provides an indication of power dissipation and therefore thermal rise conditions within sensor 8, and a thermal model solver 64 uses estimate $V_S$ and an indication $\theta_{die}$ of the temperature of the die, to generate estimated sensor temperature $T_S$, which may then be used in system 40 of FIG. 4 to perform temperature-corrected measurement, in accordance with an embodiment of the disclosure.

Figure 7:
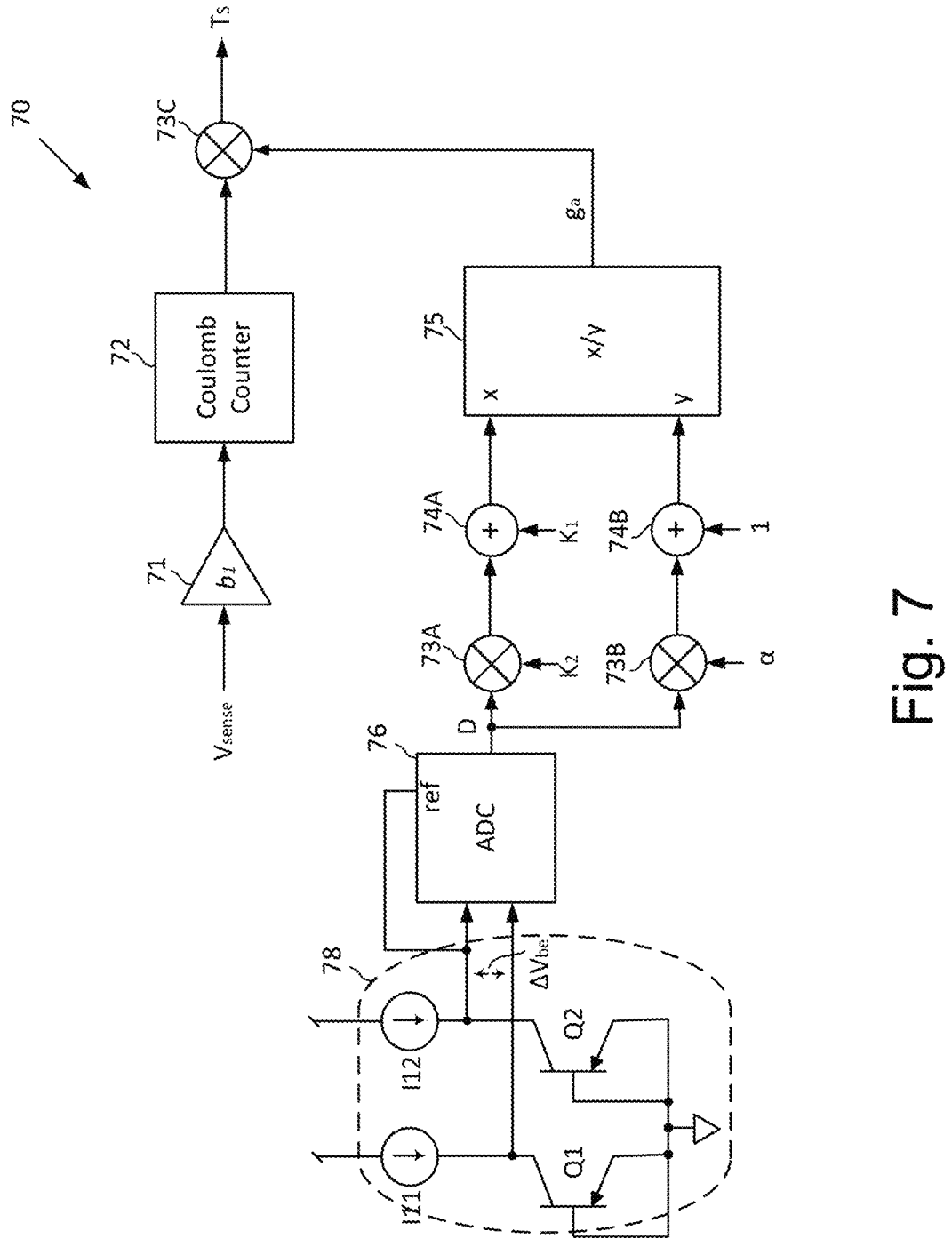
FIG. 7 is a block diagram showing an example temperature estimation circuit 70, as may be used to implement temperature estimation block in system 40 of FIG. 4, in accordance with an embodiment of the disclosure.

FIG. 7 is a block diagram showing an example temperature estimation circuit 70, as may be used to implement temperature estimation block in system 40 of FIG. 4, in accordance with an embodiment of the disclosure. A band-gap proportional-to-absolute-temperature (PTAT) sensor 78 is implemented by a pair of bipolar transistors Q1, Q2 and a pair of corresponding current sources I11, I12. The base-emitter voltage $V_{BE}$ of each of transistors Q1, Q2 is proportional to absolute temperature, so that output $\Delta V_{BE}$ of PTAT sensor 78 represents the temperature difference between transistors Q1, Q2, one of which may be located adjacent to sensor 8 in system 40 of FIG. 4, and the other located elsewhere on the die, or exposed to ambient temperature, in order to obtain estimated sensor temperature $T_S$. An ADC 76 converts PTAT output $\Delta V_{BE}$ to a digital value D, and normalizes digital value D to a nominal temperature value by using one of the output signals from PTAT 78 to supply a reference input ref. As described above with reference to FIG. 4, sensor output voltage $V_{SENSE}$ is scaled by factor $b_1$ by a scaler/multiplier 71, and the result is provided to a Coulomb counter 72. A pair of multipliers 73A, 73B and a pair of adders/combiners 74A, 74B scale and augment digital value D. The outputs of adders/combiners 74A, 74B are combined by a ratio block (divider) 75 to obtain a gain value $g_A$:

$$g_A = \frac{1 + \alpha D}{K_1 + K_2 D}.$$

A multiplier 73C then scales the output of Coulomb counter 72 to generate estimated sensor temperature $T_S$. Scale factors α, $K_1$, and $K_2$ may be determined empirically for a particular design, or may be calibrated at factory or on-line test as needed for a particular application.

In summary, this disclosure shows and describes measurement systems including integrating ADCs and their methods of operation. The systems may include a first sensor for generating an electrical output and an integrating analog-to-digital converter (ADC) having a first converter circuit that first converts the output of the sensor to provide first digital output values, a second converter circuit that converts residues of the first converter to provide second digital output values, a combiner that combines the first digital output values with the second digital output values to provide an output of the analog-to-digital converter, and a control circuit that controls conversions of the first converter circuit and the second converter circuit. The systems may also include a second sensor for providing an indication of a temperature of the first sensor, and in some embodiments, the control circuit may be coupled to the second sensor and may adjust a second rate of operation of the second converter independent of a first rate of operation of the first converter in conformity with the indication of the temperature of the first sensor. In some embodiments, the first sensor may be a sense resistor, the sense resistor may be integrated on a die with the integrating analog-to-digital converter, and the measure of the temperature of the first sensor may be a temperature of the die. In some embodiments, the indication of the temperature of the first sensor may be an estimated sensor temperature determined from a temperature of a die on which the analog-to-digital converter system is integrated. In some embodiments, the indication of the temperature of the first sensor may be an estimated sensor temperature determined from a temperature of a circuit conductor or a device other than the sensor and external to a die on which the analog-to-digital converter system is integrated.

In some embodiments, the second converter circuit may further include a differentiator that differentiates a sequence of the second digital output values, a temperature corrector that applies a temperature correction to an output of the differentiator, an integrator that integrates a temperature-corrected output of the temperature corrector, and a combiner that adds the first digital output values to an output of the integrator to provide the output of the integrating analog-to-digital converter. In some embodiments, the temperature corrector may generate the temperature correction from a thermal model of the system and one or more indications of the temperature of the sensor. In some embodiments, the first converter circuit may include a delta-sigma modulator that samples the output of the sensor to generate a delta-sigma modulated stream and an accumulator that accumulates the delta-sigma modulated stream to provide the first digital output values. In some embodiments, the second converter circuit may be a successive-approximation register (SAR) converter that converts an output of an integrator of the delta-sigma modulator.

In other embodiments, the differentiator, temperature corrector, integrator, and combiner may be used to provide, temperature correction without independently adjusting the rates of the first and second ADC. In some embodiments, the temperature corrector may include a dual bandgap temperature sensor for generating the indication of the temperature of the sensor as a first sensor voltage and a second sensor voltage indicative of an ambient temperature, an analog-to-digital converter (ADC) that converts the sensor voltage to a digital temperature difference, and a digital processing block that computes the temperature correction from the digital temperature value as a polynomial corresponding to the thermal model of the system. In some embodiments, one of the first sensor voltage or the second sensor voltage may be coupled to a reference input of the ADC, so that the digital temperature difference is normalized to the ambient temperature or the temperature of the sensor.

While the disclosure has shown and described particular embodiments of the techniques disclosed herein, it will be understood by those skilled in the art that the foregoing and other changes in form, and details may be made therein without departing from the spirit and scope of the disclosure. For example, the techniques shown above may be applied to other types of circuits and converters having temperature changes over a measurement cycle.

What is claimed is:

1. A method of reducing error due to sensor temperature variation in an integrating analog-to-digital converter (ADC) system, the method comprising:

first converting an output of the sensor to provide first digital output values;

second converting residues of the first converting to provide second digital output values;

combining the first digital output values with the second digital output values to provide an output of the analog-to-digital converter system;

obtaining a measure of a temperature of the sensor; and adjusting a second rate of the second converting independent of a first rate of the first converting in conformity with the measure of the temperature of the sensor.

2. The method of claim 1, wherein the sensor is a sense resistor.

3. The method of claim 2, wherein the sense resistor is integrated on a die with the analog-to-digital converter system, and wherein the measure of the temperature of the sensor is a temperature of the die.

4. The method of claim 2, wherein the measure of the temperature of the sensor is an estimated sensor temperature determined from a temperature of a die on which the analog-to-digital converter system is integrated.

5. The method of claim 1, wherein the measure of the temperature of the sensor is an estimated sensor temperature determined from a temperature of a trace of device other than the sensor and external to a die on which the analog-to-digital converter system is integrated.

6. The method of claim 1, wherein the combining comprises:

differentiating a sequence of the second digital output values;

applying a temperature correction to a result of the differentiating;

second integrating the temperature-corrected result of the applying the temperature correction; and adding the first digital output values to results of the second integrating to provide the output of the analog-to-digital converter system.

7. The method of claim 6, wherein the temperature correction is generated from a thermal model of the system and one or more indications of the temperature of the sensor.

8. The method of claim 1, wherein the first converting comprises:

sampling the output of the sensor to generate a delta-sigma modulated stream; and accumulating the delta-sigma modulated stream to provide the first digital output values.

9. The method of claim 8, wherein the second converting comprises performing successive approximation register (SAR) conversion on an output of an integrator of a delta-sigma modulator that generates the delta-sigma modulated stream.

10. A method of reducing error due to sensor temperature variation in an integrating analog-to-digital converter (ADC) system, the method comprising:

first converting an output of the sensor to provide first digital output values;

second converting residues of the first converting to provide second digital output values;

measuring the sensor temperature;

differentiating a sequence of the second digital output values;

applying a temperature correction generated from a result of measuring the sensor temperature to a result of the differentiating;

second integrating the temperature-corrected result of the applying the temperature correction; and adding the first digital output values to results of the second integrating to provide the output of the analog-to-digital converter system.

11. The method of claim 10, wherein the measuring of the temperature of the sensor is performed by estimating sensor temperature by determining a temperature of a trace of device other than the sensor and external to a die on which the analog-to-digital converter system is integrated and generating the sensor temperature from a result of the estimating.

12. The method of claim 10, wherein the temperature correction is generated from a thermal model of the system and one or more indications of the temperature of the sensor.

13. The method of claim 12, wherein the measuring the sensor temperature is performed with a dual bandgap temperature sensor for generating the temperature of the sensor as a first sensor voltage, wherein the dual bandgap temperature sensor further generates a second sensor voltage indicative of an ambient temperature, and wherein the method further comprises:

converting the sensor voltage to a digital temperature difference with an analog-to-digital converter (ADC); and computing the temperature correction from the digital temperature value as a polynomial corresponding to the thermal model of the system with a digital processing block.

14. The method of claim 13, further comprising normalizing the digital temperature difference to the ambient temperature or the temperature of the sensor by coupling one of the first sensor voltage or the second sensor voltage to a reference input of the ADC.

15. The method of claim 10, wherein the first converting comprises:

sampling the output of the sensor to generate a delta-sigma modulated stream; and accumulating the delta-sigma modulated stream to provide the first digital output values.

16. The method of claim 15, wherein the second converting comprises performing successive approximation register (SAR) conversion on an output of an integrator of a delta-sigma modulator that generates the delta-sigma modulated stream.

17. A system, comprising:

a first sensor for generating an electrical output;

an integrating analog-to-digital converter (ADC) having a first converter circuit that first converts the output of the sensor to provide first digital output values, a second converter circuit that converts residues of the first converter to provide second digital output values, a combiner that combines the first digital output values with the second digital output values to provide an output of the analog-to-digital converter, and a control circuit that controls conversions of the first converter circuit and the second converter circuit; and a second sensor for providing an indication of a temperature of the first sensor, and wherein the control circuit is coupled to the second sensor and adjusts a second rate of operation of the second converter independent of a first rate of operation of the first converter in conformity with the indication of the temperature of the first sensor.

18. The system of claim 17, wherein the first sensor is a sense resistor.

19. The system of claim 18, wherein the sense resistor is integrated on a die with the integrating analog-to-digital converter, and wherein the measure of the temperature of the first sensor is a temperature of the die.

20. The system of claim 18, wherein the indication of the temperature of the first sensor is an estimated sensor temperature determined from a temperature of a die on which the analog-to-digital converter system is integrated.

21. The system of claim 17, wherein the indication of the temperature of the first sensor is an estimated sensor temperature determined from a temperature of a circuit conductor or a device other than the first sensor and external to a die on which the analog-to-digital converter system is integrated.

22. The system of claim 17, wherein the second converter circuit further comprises:

a differentiator that differentiates a sequence of the second digital output values;

a temperature corrector that applies a temperature correction to an output of the differentiator;

an integrator that integrates a temperature-corrected output of the temperature corrector; and a combiner that adds the first digital output values to an output of the integrator to provide the output of the integrating analog-to-digital converter.

23. The system of claim 22, wherein the temperature corrector generates the temperature correction from a thermal model of the system and one or more indications of the temperature of the sensor.

24. The system of claim 17, wherein the first converter circuit comprises:

a delta-sigma modulator that samples the output of the sensor to generate a delta-sigma modulated stream; and an accumulator that accumulates the delta-sigma modulated stream to provide the first digital output values.

25. The system of claim 24, wherein the second converter circuit is a successive-approximation register (SAR) converter that converts an output of an integrator of the delta-sigma modulator.

26. A system, comprising:

a first sensor for generating an electrical output;

a second sensor for providing an indication of the temperature of the first sensor, an integrating analog-to-digital converter (ADC) having a first converter circuit that first converts the output of the first sensor to provide first digital output values, a second converter circuit that converts residues of the first converter to second digital output values, a combiner that combines the first digital output values with the second digital output values to provide an output of the analog-to-digital converter, and a control circuit that controls conversions of the first converter circuit and the second converter circuit;

a differentiator that differentiates a sequence of the second digital output values;

a temperature corrector that applies a temperature correction in accordance with the indication of the temperature of the first sensor to an output of the differentiator;

an integrator that integrates a temperature-corrected output of the temperature corrector; and a combiner that adds the first digital output values to an output of the integrator to provide the output of the integrating analog-to-digital converter.

27. The system of claim 26, wherein the indication of the temperature of the first sensor is an estimated sensor temperature determined from a temperature of a circuit conductor or a device other than the first sensor and external to a die on which the analog-to-digital converter system is integrated.

28. The system of claim 26, wherein the temperature corrector generates the temperature correction from a thermal model of the system and one or more indications of the temperature of the first sensor.

29. The system of claim 28, wherein the temperature corrector comprises:
a dual bandgap temperature sensor for generating the indication of the temperature of the first sensor as a first sensor voltage and a second sensor voltage indicative of an ambient temperature;
an analog-to-digital converter (ADC) that converts the sensor voltage to a digital temperature difference; and a digital processing block that computes the temperature correction from the digital temperature value as a polynomial corresponding to the thermal model of the system.

30. The system of claim 29, wherein one of the first sensor voltage or the second sensor voltage is coupled to a reference input of the ADC, whereby the digital temperature difference is normalized to the ambient temperature or the temperature of the first sensor.

31. The system of claim 29, wherein the second converter circuit is a successive-approximation register (SAR) converter that converts an output of an integrator of the delta-sigma modulator.

32. The system of claim 26, wherein the first converter circuit comprises:
a delta-sigma modulator that samples the output of the sensor to generate a delta-sigma modulated stream; and
an accumulator that accumulates the delta-sigma modulated stream to provide the first digital output values.

* * * * *